United States Patent
Lee (10) Patent No.: US 9,025,402 B1
(45) Date of Patent: May 5, 2015

(54) SEMICONDUCTOR MEMORY APPARATUS FOR CONTROLLING DUMMY BLOCK

(71) Applicant: SK Hynix Inc., Icheon-si Gyeonggi-do (KR)

(72) Inventor: Doo Chan Lee, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/218,440

(22) Filed: Mar. 18, 2014

(30) Foreign Application Priority Data

Nov. 29, 2013 (KR) ......................... 10-2013-0147079

(51) Int. Cl.
*G11C 7/22* (2006.01)
*G11C 8/12* (2006.01)
*G11C 8/10* (2006.01)

(52) U.S. Cl.
CPC .. *G11C 8/12* (2013.01); *G11C 8/10* (2013.01); *G11C 7/22* (2013.01); *G11C 7/222* (2013.01)

(58) Field of Classification Search
CPC ...... G11C 7/22; G11C 7/222; G11C 11/4076; G11C 7/1051; G11C 7/1066
USPC ................... 365/194, 210.1, 185.11
See application file for complete search history.

(56) References Cited

U.S. PATENT DOCUMENTS

2013/0208538 A1 * 8/2013 Yang et al. ................. 365/185.2

FOREIGN PATENT DOCUMENTS

KR 1020090048886 A 5/2009

* cited by examiner

*Primary Examiner* — Jason Lappas
(74) *Attorney, Agent, or Firm* — William Park & Associates Ltd.

(57) ABSTRACT

A semiconductor memory apparatus may include a memory bank, row decoders, and an intersection region circuit. The row decoder may be configured to select a dummy block and a plurality of sub blocks based on row address signals, a bank select signal, and a dummy delayed bank select signal. The intersection region circuit may delay the bank select signal and may generate a delayed bank select signal and a dummy delayed bank select signal.

14 Claims, 5 Drawing Sheets

SEMICONDUCTOR MEMORY APPARATUS FOR CONTROLLING DUMMY BLOCK

CROSS-REFERENCES TO RELATED APPLICATION

The present application claims priority under 35 U.S.C. §119(a) to Korean application number 10-2013-0147079, filed on Nov. 29, 2013, in the Korean Intellectual Property Office, which is incorporated herein by reference in its entirety.

BACKGROUND

1. Technical Field

Various embodiments generally relate to a semiconductor memory apparatus, and more particularly, to a semiconductor memory apparatus which includes a dummy memory cell block.

2. Related Art

In general, a semiconductor memory apparatus includes a memory bank for storing data. A plurality of bit lines and a plurality of word lines are disposed in the memory bank, and a plurality of memory cells are formed at points where the bit lines and the word lines cross each other. The plurality of memory cells may be electrically coupled with sense amplifiers through the bit lines. The data stored in the memory cells may be outputted or data may be written in the memory cells, through amplifying operations of the sense amplifiers.

Figure 1:
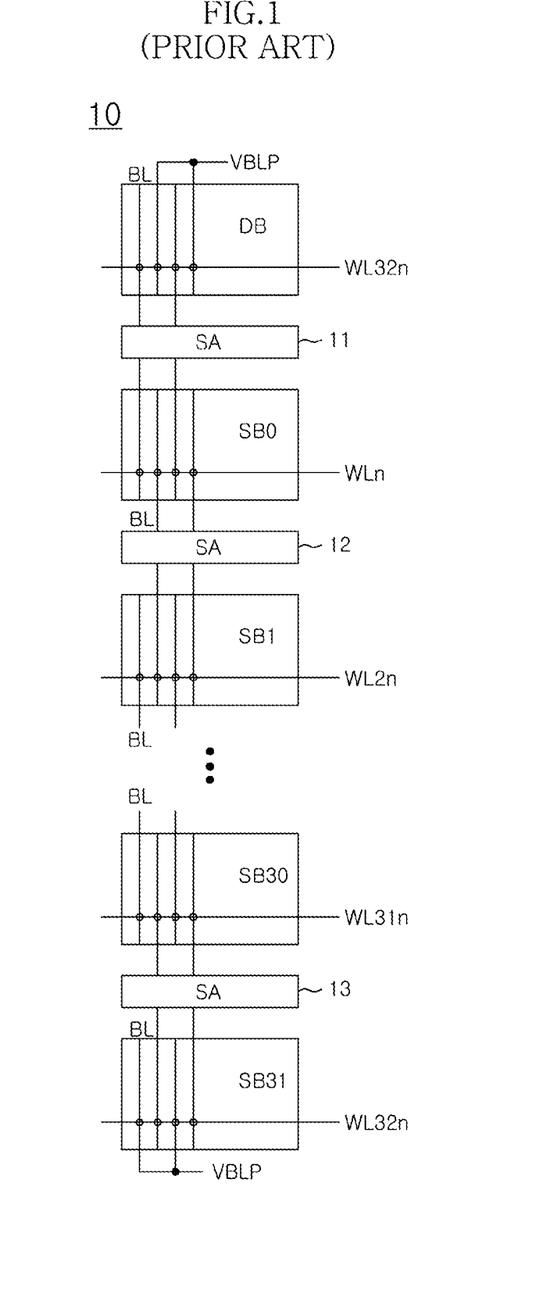
FIG. 1 is a diagram showing the configuration of a conventional memory bank having an open bit line structure.

FIG. 1 is a diagram showing the configuration of a conventional memory bank 10 having an open bit line structure. In FIG. 1, the memory bank 10 includes first to thirty second sub blocks SB0 to SB31, and bit line sense amplifier arrays (SA) 11 to 13 are disposed between the sub blocks. The bit line sense amplifier arrays 11 to 13 are shared by adjacent sub blocks. A plurality of bit lines BL and a plurality of word lines WLn, WL2n, WL3n and WL32n may be disposed in the respective sub blocks. The first sub block SB0 may share the bit line sense amplifier array 12 with the second sub block SB1, and the thirty first sub block SB30 may share the bit line sense amplifier array 13 with the thirty second sub block SB31. For example, one half of the bit lines BL which are disposed in the second sub block SB1 may be electrically coupled with the bit line sense amplifier array 12 which is shared by the previously adjacent first sub block SB0, and the other half of the bit lines BL may be electrically coupled with a bit line sense amplifier array which is shared by a next adjacent sub block (a third sub block, although not shown). Accordingly, one half of the bit lines may be amplified by the bit line sense amplifier array 12 by being paired with the bit lines disposed in the first sub block SB0, and the other half of the bit lines may be amplified by the bit line sense amplifier array by being paired with the bit lines disposed in the third sub block.

Although one half of the bit lines BL which are disposed in the first sub block SB0 is electrically coupled with the bit line sense amplifier array 12 which is shared by the second sub block SB1, the other half of the bit lines BL which are disposed in the first sub block SB0 are not used, which may be problematic. Also, although one half of the bit lines BL which are disposed in the thirty second sub block SB31 is electrically coupled with the bit line sense amplifier array 13 which is shared by the thirty first sub block SB30, memory cells which are electrically coupled with the other half of the bit lines BL are not used, which may be problematic. Therefore, the memory bank 10 may additionally include a dummy block DB. The dummy block DB may share the bit line sense amplifier array 11 with the first sub block SB0, and may provide bit lines to be sensed together with the bit lines BL which are disposed in the first sub block SB0. The other half of the bit lines of the dummy block DB may be electrically coupled with a bit line precharge voltage VBLP. Also, one half of the bit lines BL of the dummy block DB, which shares the bit line sense amplifier array 11 with the first sub block SB0, is configured to replace the other half of the bit lines BL of the thirty second sub block SB31. That is to say, the other half of the thirty second sub block SB31 and the one half of the dummy block DB may operate logically as the thirty second sub block SB31. Due to this fact, when writing data in the thirty second sub block SB31 or reading data from the thirty second sub block SB31, the word line WL32n of the thirty second sub block SB31 and the word line WL32n of the dummy block DB are simultaneously selected.

SUMMARY

In an embodiment, a semiconductor memory apparatus may include: a memory bank including a dummy block and a plurality of sub blocks; a row decoder configured to select the dummy block and the plurality of sub blocks based on row address signals, a delayed bank select signal and a dummy delayed bank select signal; and an intersection region circuit configured to delay a bank select signal and generate the delayed bank select signal and the dummy delayed bank select signal.

In an embodiment, a semiconductor memory apparatus may include: a memory bank including a dummy block and a plurality of sub blocks; a row decoder including a plurality of block selection units which are respectively allocated to the dummy block and the plurality of sub blocks and configured to select the dummy block and the plurality of sub blocks based on a bank select signal and row address signals; and an intersection region circuit configured to provide the bank select signal and the row address signals to the row decoder such that the bank select signal is delayed by a first predetermined time and a resultant signal is provided to the block selection units for selecting the plurality of sub blocks and that the bank select signal may be delayed by the first predetermined time and a second predetermined time and a resultant signal is provided to the block selection unit for selecting the dummy block.

In an embodiment, a system may include: a processor; a chipset configured to couple with the processor; a memory controller configured to receive data provided from the processor through the chipset; and a memory device configured to receive the data and comprises a semiconductor memory apparatus, the semiconductor memory apparatus may include: a memory bank including a dummy block and a plurality of sub blocks; a row decoder configured to select the dummy block and the plurality of sub blocks based on row address signals, a delayed bank select signal and a dummy delayed bank select signal; and an intersection region circuit configured to delay a bank select signal and generate the delayed bank select signal and the dummy delayed bank select signal.

DETAILED DESCRIPTION

Hereinafter, a semiconductor memory apparatus for controlling a dummy block according to the present disclosure will be described below with reference to the accompanying drawings through various examples of embodiments. Various embodiments are directed to a semiconductor memory apparatus which may delay a bank select signal and provide a resultant signal to a dummy block.

Figure 2:
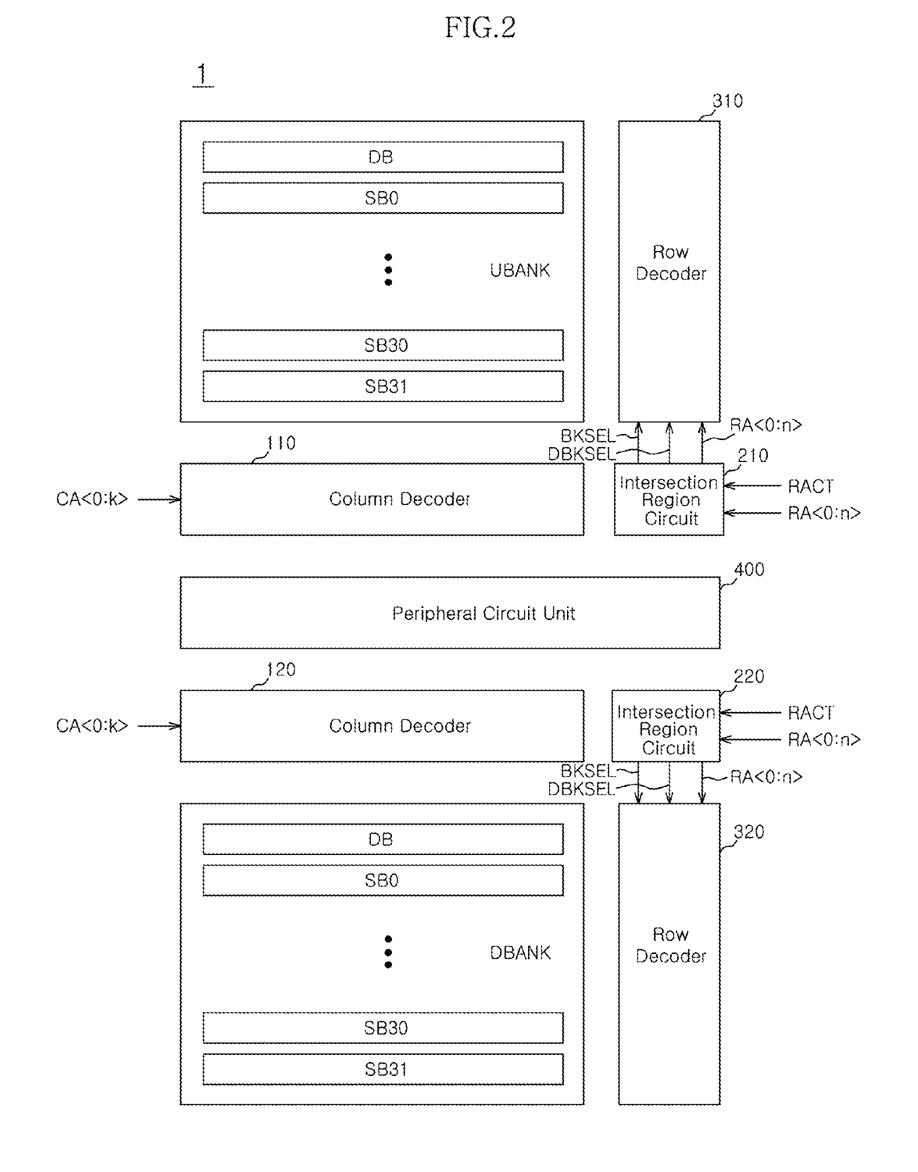
FIG. 2 is a diagram showing the configuration of a semiconductor memory apparatus in accordance with an embodiment.

In FIG. 2, a semiconductor memory apparatus 1 in accordance with an embodiment may include memory banks, column decoders 110 and 120, intersection region circuits 210 and 220, row decoders 310 and 320, and a peripheral circuit unit 400. The memory banks may include an up bank UBANK and a down bank DBANK, and it is shown in the drawing that the up bank UBANK is disposed in upper position and the down bank DBANK is disposed in a lower position. A plurality of word lines and a plurality of bit lines are disposed in each up bank UBANK and down bank DBANK, and each up bank UBANK and down bank DBANK may include a plurality of sub blocks SB0 to SB31 each including a plurality of memory cells which are formed at points where the word lines and the bit lines cross each other. Each up bank UBANK and down bank DBANK may have an open bit line structure and may include a dummy block DB. Although not shown, a bit line sense amplifier array may be disposed between the dummy block DB and the sub blocks SB0 to SB31. The column decoders 110 and 120 may select bit lines which are to be accessed, among the bit lines which are disposed in the up bank UBANK and the down bank DBANK, based on column address signals CA<0:k> (where k may be a natural number greater than 0 for example).

The intersection region circuits 210 and 220 may receive a bank select signal RACT and row address signals RA<0:n> (where n may be a natural number greater than 0 for example), and buffer the bank select signal RACT and the row address signals RA<0:n>, and provide resultant signals to the row decoders 310 and 320. Particularly, the intersection region circuits 210 and 220 may delay the bank select signal RACT and provide a resultant signal to the row decoders 310 and 320. Also, the intersection region circuits 210 and 220 may further delay the bank select signal RACT and provide a resultant signal to the row decoders 310 and 320, in order for the dummy blocks DB which constitute the up bank UBANK and the down bank DBANK. The intersection region circuits 210 and 220 may generate a delayed bank select signal BKSEL and a dummy delayed bank select signal DBKSEL, respectively, by delaying the bank select signal RACT, and provide the delayed bank select signal BKSEL, the dummy delayed bank select signal DBKSEL and the row address signals RA<0:n> to the row decoders 310 and 320.

The row decoders 310 and 320 may receive the delayed bank select signal BKSEL, the dummy delayed bank select signal DBKSEL and the row address signals RA<0:n> from the intersection region circuits 210 and 220, and select the sub blocks SB0 to SB31 in which word lines to access among the word lines disposed in the up bank UBANK and the down bank DBANK are disposed. The row decoders 310 and 320 may select the sub blocks SB0 to SB31 based on redundancy information together with the bank select signal RACT and the row address signals RA<0:n>. Each of the row decoders 310 and 320 may include a circuit having information related with the repair of the memory cells. The circuit may replace a word line which is electrically coupled with a memory cell in which a fail has occurred, with a redundant word line, and may allow the redundant word line to be selected instead of a word line when the word line electrically coupled with the failed memory cell is selected based on the row address signals RA<0:n>. Further detailed explanations related with this will be described later.

The peripheral circuit unit 400 may include all circuits for transmitting data to be written to the up bank UBANK and the down bank DBANK or for transmitting the data read from the up bank UBANK and the down bank DBANK. That is to say, the peripheral circuit unit 400 may mean all regions except a core region in which the up bank UBANK, the down bank DBANK, the column decoders 110 and 120, the row decoders 310 and 320, and the intersection region circuits 210 and 220 are disposed, among regions which constitute the semiconductor memory apparatus 1.

As shown in FIG. 2, in each up bank UBANK and down bank DBANK, the dummy block DB is disposed up, and first to thirty second sub blocks SB0 to SB31 are sequentially disposed below the dummy block DB. The dummy block DB in the up bank UBANK may be disposed farthest away from the intersection region circuit 210 when compared to the first to thirty second sub blocks SB0 to SB31, and the dummy block DB in the down bank DBANK may be disposed closer to the intersection region circuit 220 than the first to thirty second sub blocks SB0 to SB31. The dummy block DB may be selected simultaneously with one sub block among the first to thirty second sub blocks SB0 to SB31, based on the row address signals RA<0:n>. In FIG. 2, since the up bank UBANK and the down bank DBANK have an open bit line structure, each dummy block DB may be selected simultaneously with the thirty second sub block SB31 which is disposed lowermost in each of the up bank UBANK and the down bank DBANK. As can be readily seen from the above descriptions, the distances from the intersection region circuits 210 and 220 to the dummy blocks DB in the up bank UBANK and the down bank DBANK are different from each other. The bank select signal RACT and the row address signals RA<0:n> are provided from the intersection region circuits 210 and 220 to the row decoders 310 and 320. Due to the disposition of the sub blocks SB0 to SB31 which are disposed in the up bank UBANK and the down bank DBANK, while a time required till the bank select signal RACT and the row address signals RA<0:n> are provided to the dummy block DB in the up bank UBANK is long, a time required till the bank select signal RACT and the row address signals RA<0:n> are provided to the dummy block DB in the down bank DBANK is short.

Figure 3:
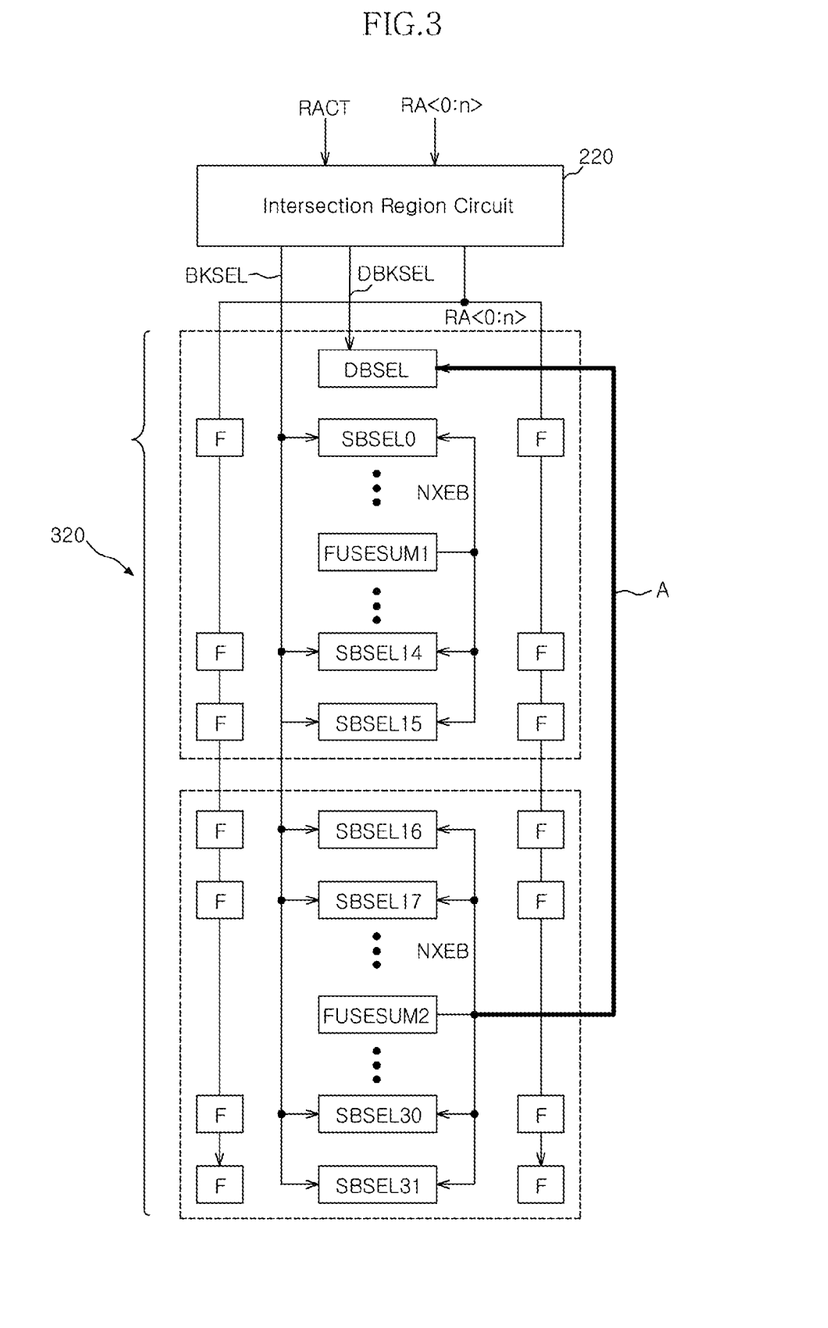
FIG. 3 is a diagram showing the configuration of an embodiment of the row decoder along with the intersection region circuit shown in FIG. 2.

FIG. 3 is a diagram showing the configuration of an embodiment of the row decoder 320 along with the intersection region circuit 220 shown in FIG. 2. FIG. 3 shows the intersection region circuit 220 and the row decoder 320 which are electrically coupled with the down bank DBANK. In FIG. 3, the intersection region circuit 220 may receive the bank select signal RACT and the row address signals RA<0:n>, and generate the delayed bank select signal BKSEL and the dummy delayed bank select signal DBKSEL from the bank select signal RACT. The intersection region circuit 220 may provide the delayed bank select signal BKSEL, the dummy delayed bank select signal DBKSEL and the row address signals RA<0:n> to the row decoder 320.

The row decoder 320 may include a plurality of block selection units DBSEL and SBSEL0 to SBSEL31, a plurality of fuse units F, and redundancy information generation units FUSESUM1 and FUSESUM2. The plurality of block selection units DBSEL and SBSEL0 to SBSEL31 may be disposed by the number of the sub blocks SB0 to SB31 and the dummy block DB which constitute the down bank DBANK. The dummy block DB is disposed up in the down bank DBANK, and the first to thirty second sub blocks SB0 to SB31 are sequentially disposed below the dummy block DB. Therefore, in the row decoder 320, the block selection unit DBSEL for selecting the dummy block DB may be disposed uppermost, and the block selection units SBSEL0 to SBSEL31 for selecting the first to thirty second sub blocks SB0 to SB31 may be sequentially disposed below the block selection unit DBSEL. The block selection units DBSEL and SBSEL0 to SBSEL31 may select sub blocks in which word lines to access are disposed, among the plurality sub blocks SB0 to SB31, based on the delayed bank select signal BKSEL, the dummy delayed bank select signal DBKSEL and a redundancy information signal NXEB.

The plurality of fuse units F may be configured by the number of the sub blocks SB0 to SB31 which constitute the down bank DBANK. The plurality of fuse units F may receive the row address signals RA<0:n>, respectively, which are provided from the intersection region circuit 220. The plurality of fuse units F may have address information for selecting word lines which are electrically coupled with failed memory cells. The plurality of fuse units F may compare the row address signals RA<0:n> received from the intersection region circuit 220 with defective address information therein, respectively, and may output comparison results to the redundancy information generation units FUSESUM1 and FUSESUM2.

The redundancy information generation units FUSESUM1 and FUSESUM2 may receive the comparison results of the plurality of fuse units F, and may output the redundancy information signal NXEB such that the sub blocks SB0 to SB31 in which word lines corresponding to the defective address information are disposed are not selected. For example, when specified row address signals RA<0:n> provided from the intersection region circuit 220 corresponds to the defective address information, of the fuse unit F associated with the fifteenth sub block SB14, the fuse unit F may output a comparison result to the redundancy information generation unit FUSESUM1, and the redundancy information generation unit FUSESUM1 may provide the redundancy information signal NXEB to the block selection unit SBSEL14 for selecting the fifteenth sub block SB14 such that the fifteenth sub block SB14 is not selected. Accordingly, the block selection unit SBSEL14 may not generate a signal for selecting the fifteenth sub block SB14, based on the redundancy information signal NXEB.

The row decoder 320 may include one redundancy information generation unit which is electrically coupled with the plurality of fuse units F respectively allocated to the sub blocks SB0 to SB31. However, in an embodiment, in order to ensure that the comparison results of the respective fuse units F are provided to the redundancy information generation unit and the redundancy information signal NXEB which is generated from the redundancy information generation unit is provided to respective block selection units SBSEL0 to SBSEL31, since the redundancy information signal NXEB should run over the entire row decoder 320, a lot of time may be required for transmitting the redundancy information signal NXEB. Therefore, the row decoder 320 may separately include the redundancy information generation unit FUSESUM1 which is electrically coupled with the block selection units SBSEL0 to SBSEL15 and the fuse units F allocated to the first to sixteenth sub blocks SB0 to SB15, and the redundancy information generation unit FUSESUM2 which is electrically coupled with the block selection units SBSEL16 to SBSEL31 and the fuse units F allocated to the seventeenth to thirty second sub blocks SB16 to SB31.

The bank select signal RACT may be delayed in the intersection region circuit 220 and may be provided to the plurality of block selection units DBSEL and SBSEL0 to SBSEL31. The bank select signal RACT may be provided to the block selection units DBSEL and SBSEL0 to SBSEL31 by being delayed by a time till the fuse units F compare the row address signals RA<0:n> with the defective address information and the redundancy information signal NXEB is generated by the redundancy information generation units FUSESUM1 and FUSESUM2 and may then be provided to the respective block selection units DBSEL and SBSEL0 to SBSEL31. Therefore, the intersection region circuit 220 may delay the bank select signal RACT by a first predetermined time and generate the delayed bank select signal BKSEL. At this time, since the dummy block DB is selected together with the thirty second sub block SB31, the block selection unit DBSEL which selects the dummy block DB receives the redundancy information signal NXEB which is generated from not a first redundancy information generation unit FUSESUM1 but a second redundancy information generation unit FUSESUM2. Therefore, a transmission path A of the redundancy information signal NXEB which is received by the block selection unit DBSEL for selecting the dummy block DB is relatively longer than transmission paths of the redundancy information signal NXEB which is received by the block selection units SBSEL0 to SBSEL31 for selecting the other sub blocks SB0 to SB31. When the block selection unit DBSEL for selecting the dummy block DB receives the delayed bank select signal BKSEL as the other sub blocks SB0 to SB31, it is likely to occur that the dummy block DB is erroneously selected based on the delayed bank select signal BKSEL before the redundancy information signal NXEB reaches the block selection unit DBSEL. To prevent this, in an embodiment, the intersection region circuit 220 may generate the dummy delayed bank select signal DBKSEL by further delaying the delayed bank select signal BKSEL which is generated as the bank select signal RACT is delayed by the first predetermined time, by a second predetermined time. The second predetermined time may correspond to a time till the redundancy information signal NXEB which is generated from the second redundancy information generation unit FUSESUM2 reaches the block selection unit DBSEL for selecting the dummy block DB.

Figure 4:
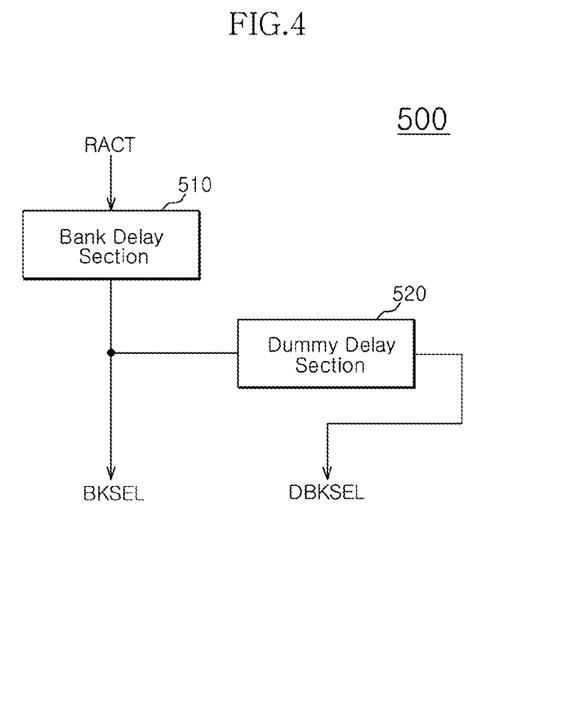
FIG. 4 is a diagram showing the configuration of an embodiment of the intersection region circuit shown in FIG. 3.

FIG. 4 is a diagram showing the configuration of an embodiment of a bank select signal delay unit 500 which constitutes the intersection region circuit 220 shown in FIG. 3. In FIG. 3, the bank select signal delay unit 500 may include a bank delay section 510 and a dummy delay section 520. The bank delay section 510 may delay the bank select signal RACT by the first predetermined time, and generate the delayed bank select signal BKSEL. The delayed bank select signal BKSEL may be provided to the respective block selection units SBSEL0 to SBSEL31 which select the sub blocks SB0 to SB31. The dummy delay section 520 may delay the delayed bank select signal BKSEL by the second predetermined time, and generate the dummy delayed bank select signal DBKSEL. The dummy delayed bank select signal DBKSEL may be provided to the block selection unit DBSEL which selects the dummy block DB. The bank delay section 510 and the dummy delay section 520 may be delay circuits which provide locked delay amounts, and may be variable delay circuits which provide delay amounts variable according to a control signal.

Figure 5:
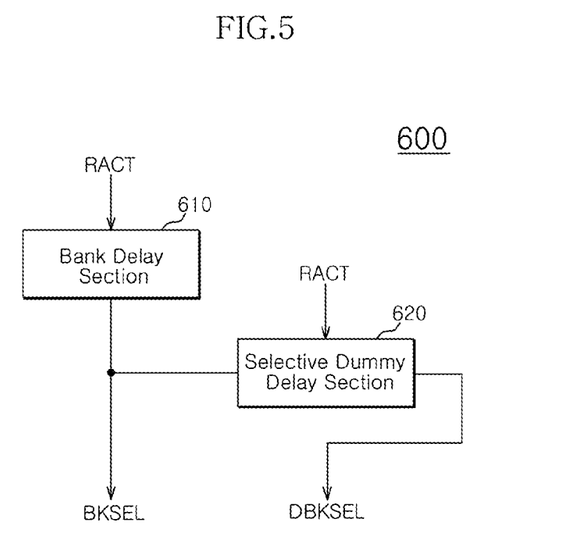
FIG. 5 is a diagram showing the configuration of an embodiment of the intersection region circuit shown in FIG. 3.

FIG. 5 is a diagram showing the configuration of an embodiment of a bank select signal delay unit 600 which may be included in the intersection region circuit 220 shown in FIG. 3. The bank select signal delay unit 600 may include a bank delay section 610 and a selective dummy delay section 620. The bank delay section 610 may delay the bank select signal RACT by the first predetermined time, and generate the delayed bank select signal BKSEL. The selective dummy delay section 620 generates the dummy delayed bank select signal DBKSEL from the delayed bank select signal BKSEL in response to the bank select signal RACT. The selective dummy delay section 620 may provide the delayed bank select signal BKSEL as the dummy delayed bank select signal DBKSEL when the bank select signal RACT has information that selects the up bank UBANK, and may provide a signal which is generated by further delaying the delayed bank select signal BKSEL by the second predetermined time, as the dummy delayed bank select signal DBKSEL when the bank select signal RACT has information that selects the down bank DBANK.

As is apparent from the above descriptions, in the up bank UBANK and the down bank DBANK, disposition of the sub blocks SB0 to SB31 and the dummy block DB are identical or substantially identical. In the intersection region circuit 220 and the row decoder 320 of the down bank DBANK shown in FIG. 3, the block selection unit DBSEL which selects the dummy block DB receives the dummy delayed bank select signal DBKSEL which is generated as the bank select signal RACT is delayed by the first and second predetermined times, in order to compensate for a time for receiving the redundancy information signal NXEB. However, since the dummy block DB in the up bank UBANK is disposed farthest away from the intersection region circuit 210, it is not necessary to compensate for an additional time for receiving the redundancy information signal NXEB as in the dummy block DB of the down bank DBANK. Accordingly, the bank select signal delay unit 600 may include the selective dummy delay section 620 which may be commonly used in the intersection region circuits 210 and 220 associated with the up bank UBANK and the down bank DBANK. The bank select signal delay unit 600 outputs the dummy delayed bank select signal DBKSEL by delaying the bank select signal RACT by the first and second predetermined times when a dummy block DB is disposed adjacent to the intersection region circuits 210 and 220, and outputs the delayed bank select signal BKSEL as the dummy delayed bank select signal DBKSEL when a dummy block DB is disposed far from the intersection region circuits 210 and 220. Accordingly, the bank select signal delay unit 600 may control a delay amount for generating the dummy delayed bank select signal DBKSEL, according to a position at which a dummy block is disposed in a selected bank.

The semiconductor memory apparatus discussed above is particular useful in the design of memory devices, processors, and computer systems. For example, referring to FIG. 6, a block diagram of a system employing the semiconductor memory apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 6:
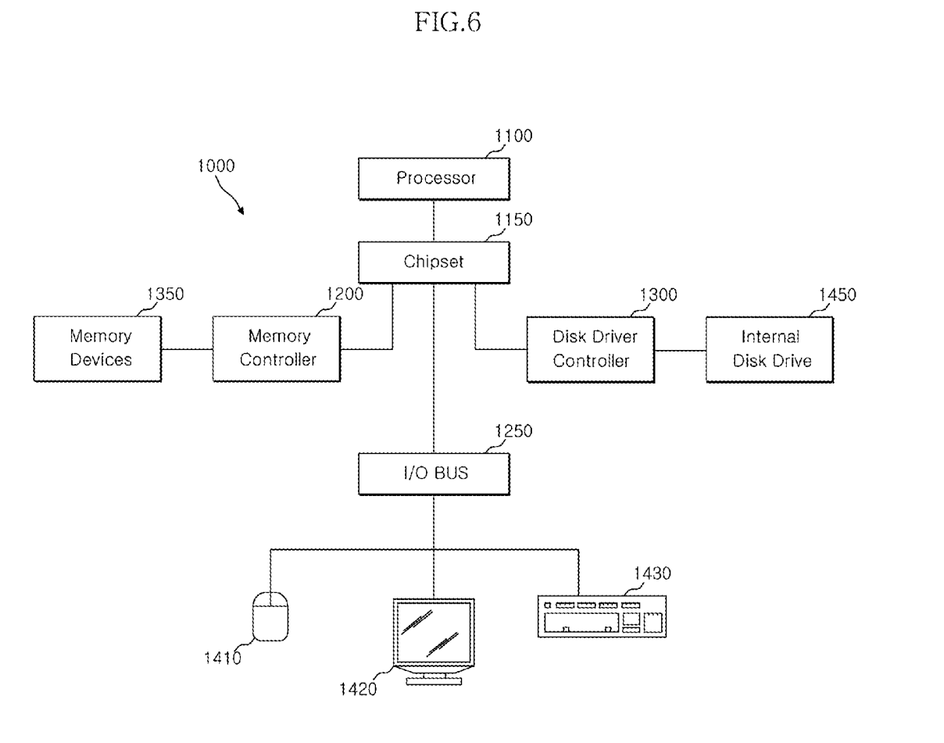
FIG. 6 illustrates a block diagram of a system employing the semiconductor memory apparatus in accordance with the embodiments discussed above with relation to FIGS. 2-5.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 2-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor memory apparatus as discussed above with relation to FIGS. 2-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor memory apparatus as discussed above with relation to FIGS. 2-5. In alternate embodiments, such as cellular phones or digital cameras, the components may differ from the embodiments shown in FIG. 6.

While various embodiments have been described above, it will be understood to those skilled in the art that the embodiments described are by way of example only. Accordingly, the semiconductor memory apparatus for controlling a dummy block described herein should not be limited based on the described embodiments. Rather, the semiconductor memory apparatus for controlling a dummy block described herein should only be limited in light of the claims that follow when taken in conjunction with the above description and accompanying drawings.

What is claimed is:

1. A semiconductor memory apparatus comprising:
a memory bank including a dummy block and a plurality of sub blocks;
a row decoder configured to select the dummy block and the plurality of sub blocks based on row address signals, a delayed bank select signal and a dummy delayed bank select signal; and
an intersection region circuit configured to delay a bank select signal and generate the delayed bank select signal and the dummy delayed bank select signal.

2. The semiconductor memory apparatus according to claim 1 wherein the row decoder includes a plurality of block selection units which are respectively allocated to the dummy block and the plurality of sub blocks.

3. The semiconductor memory apparatus according to claim 2, wherein the dummy block and the plurality of sub blocks are sequentially disposed in the memory bank, and the dummy block and the sub block which is disposed furthest from the dummy block are configured to be simultaneously selected.

4. The semiconductor memory apparatus according to claim 2, wherein the row decoder further comprises:
a plurality of fuse units respectively allocated to the plurality of sub blocks, configured to include defective address information, and configured to compare the row address signals with the defective address information; and
a redundancy information generation unit configured to generate a redundancy information signal based on comparison results of the fuse units, and provide the redundancy information signal to the plurality of block selection units.

5. The semiconductor memory apparatus according to claim 2, wherein the block selection unit for selecting the dummy block receives the dummy delayed bank select signal, and the block selection units for selecting the plurality of sub blocks receive the delayed bank select signal.

6. The semiconductor memory apparatus according to claim 5,
wherein the dummy block is disposed closer to the intersection region circuit than the plurality of sub blocks, and
wherein the intersection region circuit comprises:
a bank delay section configured to delay the bank select signal by a first predetermined time and generate the delayed bank select signal; and
a dummy delay section configured to delay the delayed bank select signal by a second predetermined time and generate the dummy delayed bank select signal.

7. The semiconductor memory apparatus according to claim 5, wherein the intersection region circuit comprises:
a bank delay section configured to delay the bank select signal by a first predetermined time and generate the delayed bank select signal; and
a selective dummy delay section configured to output the delayed bank select signal as the dummy delayed bank select signal or delay the delayed bank select signal by a second predetermined time and output the dummy delayed bank select signal, in response to the bank select signal.

8. The semiconductor memory apparatus according to claim 7, wherein the selective dummy delay section delays the delayed bank select signal by the second predetermined time in response to the bank select signal and generates the dummy delayed bank select signal, when the dummy block is disposed closer to the intersection region circuit than the plurality of sub blocks.

9. The semiconductor memory apparatus according to claim 7, wherein the selective dummy delay section provides the delayed bank select signal as the dummy delayed bank select signal in response to the bank select signal when the dummy block is disposed farther from the intersection region circuit than the plurality of sub blocks.

10. A semiconductor memory apparatus comprising:
a memory bank including a dummy block and a plurality of sub blocks;
a row decoder including a plurality of block selection units which are respectively allocated to the dummy block and the plurality of sub blocks and configured to select the dummy block and the plurality of sub blocks based on a bank select signal and row address signals; and
an intersection region circuit configured to provide the bank select signal and the row address signals to the row decoder such that the bank select signal is delayed by a first predetermined time and a resultant signal is provided to the block selection units for selecting the plurality of sub blocks and that the bank select signal is delayed by the first predetermined time and a second predetermined time and a resultant signal is provided to the block selection unit for selecting the dummy block.

11. The semiconductor memory apparatus according to claim 10, wherein the dummy block and the plurality of sub blocks are sequentially disposed in the memory bank, and the dummy block and the sub block which is disposed furthest from the dummy block are configured to be simultaneously selected.

12. The semiconductor memory apparatus according to claim 10, wherein the dummy block is disposed closer to the intersection region circuit than the plurality of sub blocks.

13. The semiconductor memory apparatus according to claim 10, wherein the row decoder further includes:
a plurality of fuse units respectively allocated to the plurality of sub blocks, including defective address information, and configured to compare the row address signals with the defective address information; and
a redundancy information generation unit configured to generate a redundancy information signal based on comparison results of the fuse units, and provide the redundancy information signal to the plurality of block selection units.

14. The semiconductor memory apparatus according to claim 10, wherein the intersection region circuit comprises:
a bank delay section configured to delay the bank select signal by a first predetermined time and generate the delayed bank select signal; and
a selective dummy delay section configured to delay the delayed bank select signal by a second predetermined time and output the dummy delayed bank select signal in response to the bank select signal.

* * * * *